(12) United States Patent
Zhou et al.

(10) Patent No.: US 6,859,054 B1
(45) Date of Patent: Feb. 22, 2005

(54) PROBE CONTACT SYSTEM USING FLEXIBLE PRINTED CIRCUIT BOARD

(75) Inventors: Yu Zhou, Vernon Hills, IL (US); David Yu, Bloomingdale, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/640,452

(22) Filed: Aug. 13, 2003

(51) Int. Cl.[7] .......................... G01R 31/02; H01L 29/40; H01L 21/4763

(52) U.S. Cl. ...................... 324/754; 324/757; 324/761; 438/618; 257/781

(58) Field of Search ................................. 324/754, 755, 324/757, 761, 762; 438/618, 613; 257/781, 784

(56) References Cited

U.S. PATENT DOCUMENTS

| | | | | |
|---|---|---|---|---|
| 4,038,599 A | * | 7/1977 | Bove et al. ................. | 324/754 |
| 4,773,877 A | * | 9/1988 | Kruger et al. .............. | 439/482 |
| 5,355,079 A | * | 10/1994 | Evans et al. ................ | 324/754 |
| 5,416,429 A | | 5/1995 | McQuade et al. | |
| 5,635,846 A | * | 6/1997 | Beaman et al. ............. | 324/754 |
| 5,852,871 A | * | 12/1998 | Khandros .................... | 29/843 |
| 5,907,245 A | | 5/1999 | Fredrickson | |
| 6,160,412 A | | 12/2000 | Martel et al. | |
| 6,305,230 B1 | | 10/2001 | Kasukabe et al. | |
| 6,330,744 B1 | | 12/2001 | Doherty et al. | |
| 6,455,335 B1 | | 9/2002 | Kohno et al. | |

* cited by examiner

Primary Examiner—Michael Tokar
Assistant Examiner—Emily Y Chan
(74) Attorney, Agent, or Firm—Muramatsu & Associates

(57) ABSTRACT

A probe contact system for establishing electrical connection with contact targets. The probe contact system is formed of a main frame, a flexible printed circuit board (PCB), a contactor carrier and a plurality of contactors. The flexible PCB has contact pads at a center area thereof and signal lines connected to the contact pads and extended to an end of the flexible PCB. The end of the flexible PCB with the signal lines is connected to a test head of a semiconductor test system. In one aspect, the contactor has a top spring to resiliently contact with the contact pads on the flexible PCB. In another aspect, the probe contact system includes a conductive elastomer sheet between the contactor and the flexible PCB thereby obviating the top spring of the contactor.

14 Claims, 19 Drawing Sheets

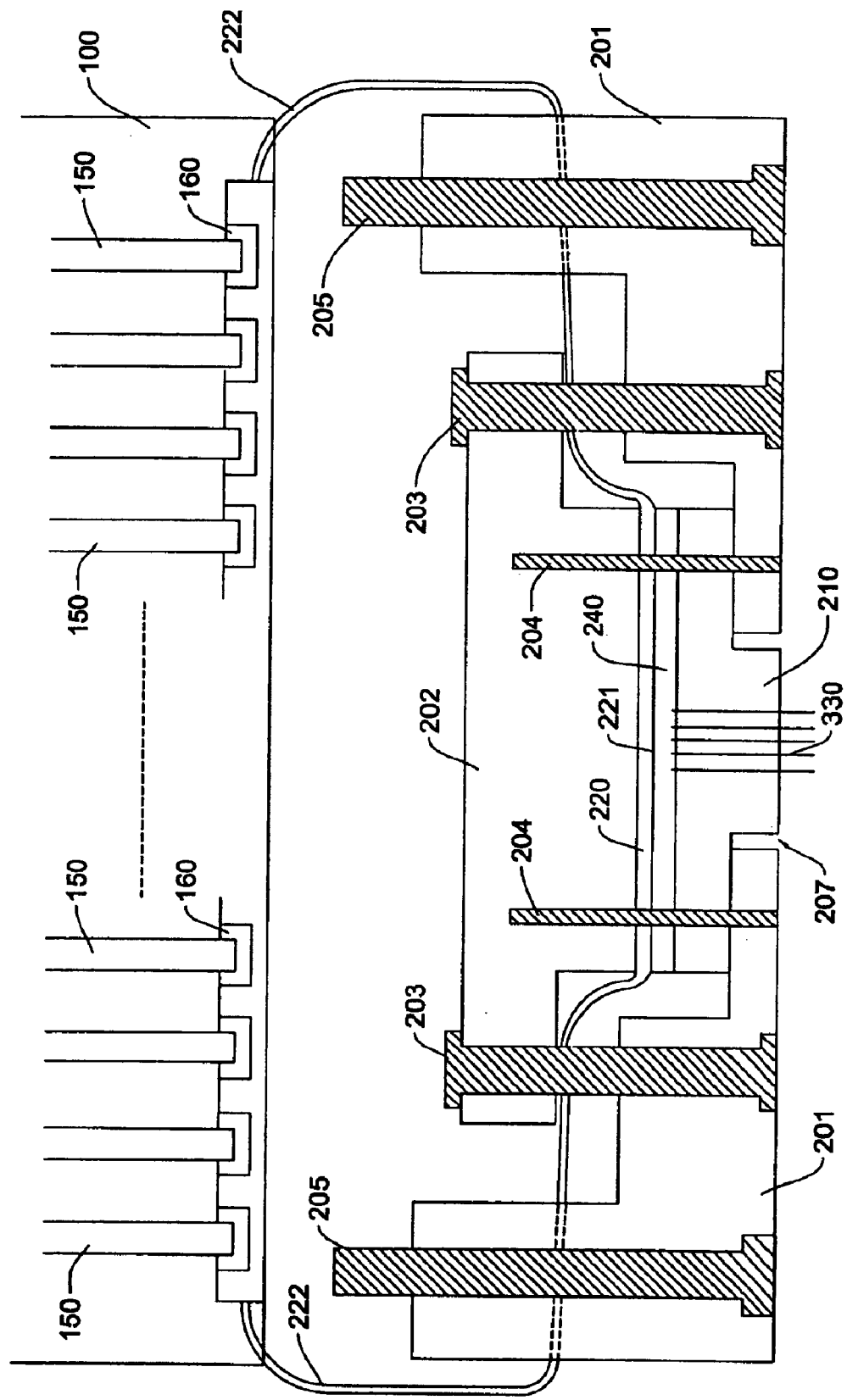

US 6,859,054 B1

PROBE CONTACT SYSTEM USING FLEXIBLE PRINTED CIRCUIT BOARD

FIELD OF THE INVENTION

This invention relates to a contact structure to establish electrical connection with contact targets such as contact pads on semiconductor devices, and more particularly, to a probe contact system using a flexible printed circuit board and a plurality of contactors mounted on a contactor carrier for testing semiconductor devices with high speed, high density and low cost.

BACKGROUND OF THE INVENTION

In testing high density and high speed electrical devices such as LSI and VLSI circuits, a high performance probe contact system has to be used. The probe contact system typically includes a contact substrate (space transformer) having a large number of contactors or probe elements, a probe card for mounting the contact substrate, and a plurality of pogo-pins for connecting between the probe card and a test head of a semiconductor test system. The probe contact system interfaces between the test head of the semiconductor test system and semiconductor devices to test or burn-in IC chips, semiconductor wafers, printed circuit boards and the like.

In case where semiconductor devices to be tested are in the form of a semiconductor wafer, a semiconductor test system such as an IC tester is usually connected to substrate handler, such as an automatic wafer prober, to automatically test the semiconductor wafer. FIG. 1 shows an example of a combination of a semiconductor test system 10 and a wafer prober (substrate handler). The semiconductor test system 10 has a test head 100 which is ordinarily in a separate housing and electrically connected to the test system with a bundle of cables 110. The test head 100 and the substrate handler 400 are mechanically as well as electrically connected with each other with the aid of a manipulator 500 which is driven by a motor 510. The semiconductor wafers to be tested are automatically provided to a test position of the test head 100 by the substrate handler 400.

FIG. 2 shows the connection between the test system and the substrate handler in more detail. The test head 100 and the substrate handler 400 are connected through an interface component (probe contact system) 140 consisting of a performance board 120, signal cables 124 such as coaxial cables, a pin block structure including a pogo-pin block 130 and contact pins (pogo-pins) 141, a probe card (170) and contactors 190. The test head 100 includes a large number of printed circuit boards (pin cards) 150 which correspond to the number of test channels (pins) of the semiconductor test system. Each of the printed circuit boards 150 has a connector 160 to receive a corresponding contact terminal 121 of the performance board 120.

The pogo-pin block 130 is mounted on an upper surface of a frame (not shown) of the substrate handler 400. A large number of pogo-pins 141 are mounted on the pogo-pin block 130. As is well known in the art, a pogo-pin is a compressive contact pin having a spring therein. The pogo-pin block 130 is to accurately hold the pogo-pins 141 relative to the probe card 170 and the substrate handler 400. In the substrate handler 400, a semiconductor device, such as a semiconductor wafer 300 to be tested is mounted on a chuck 180.

Contact pads (electrodes) on the upper surface of the probe card 170 are electrically connected to the pogo-pins 141 when the pogo-pin block 130 is pressed against the probe card 170. Because each pogo-pin 141 is elastic in the longitudinal direction by the spring therein, it is able to overcome the planarization problem (unevenness of the surface flatness) involved in the probe card, wafer prober frames, or the like. The pogo-pins 141 are also connected to the contact terminals 121 of the performance board 120 through the coaxial cables 124 where each contact terminal 121 of the performance board 120 is connected to the printed circuit boards 150 of the test head 100. Further, the printed circuit boards 150 are connected to the semiconductor test system through the cable 110 having several hundreds of inner cables.

The probe contactors 190 mounted on the probe card 170 through a space transformer (not shown) contact with the surface (contact targets) of the semiconductor wafer 300 on the chuck 180 to apply test signals to the semiconductor wafer 300 and receive the resultant output signals from the semiconductor wafer 300. The resultant output signals from the wafer 300 under test are compared with the expected data generated by the semiconductor test system to determine whether the IC circuits on the semiconductor wafer 300 function correctly.

FIG. 3 is a cross sectional view showing an example of probe contact system formed with a pogo-pin block 130, a probe card 60, a space transformer (contact substrate) 50, and a contactor carrier 40. Typically, the contactor carrier 40 is provided with a large number of contactors 30. In the example of FIG. 3, the space transformer 50 is incorporated to fan-out the small pitch of the contactors 30 on the contactor carrier 40 to the large pitch of the contact pads 62 on the probe card 60. The space transformer 50 has a large number of inner patterns 52 and 54 to change the space (pitch) of the contactors 30. The space transformer 50 has many signal patterns and is made of, for example, multi-layers of ceramic substrate, and is costly.

Interconnect traces 63 of the probe card 60 further fans-out the pitch so that contact pads 65 of the probe card 60 can contact with pogo-pins 141 of the pogo-pin block 130.

FIG. 3 further shows a semiconductor wafer 300 having contact pads 320 thereon as contact targets. The pogo-pin block 130 and probe card 60 in FIG. 3 respectively correspond to the pogo-pin block 130 and probe card 60 in FIG. 2. Thus, the pogo-pin block 130 has a large number of pogo-pins (contact pins) 141 to interface between the probe card 60 and the performance board 120 (FIG. 2). At upper ends of the pogo-pins 141, cables 124 such as coaxial cables are connected to transmits signals to the printed circuit boards (pin cards) 150 in the test head 100 through the performance board 120.

As shown in FIG. 3, the carrier 40 is provided with plurality of contactors 30. The carrier 40 is so positioned over the contact targets such as contact pads 320 on a semiconductor wafer 300 to be tested that the contactors 30 establish electrical connections with the semiconductor wafer 300 when pressed against the other. Although only two contactors 30 are shown in FIG. 3, a large number, such as several hundreds or several thousands of contactors 30 are aligned on the carrier 40 in actual applications such as semiconductor wafer testing.

The contactor 30 in this example has a top contact portion protruding through the top surface of the carrier 40 to electrically connect with the contact pad of the space transformer 50, a body portion that is housed in the via hole of the carrier 40, a spring portion projected from the bottom surface of the carrier 40 and bent to produce a resilient contact force when pressed against the contact target, and a bottom contact portion that establishes electrical contact with the contact targets 320 on the wafer 300. The contactors 30 can be made through a semiconductor production process including, for example, photolithography and electroplating process on a silicon substrate.

When the semiconductor wafer 300 moves upward, the contactors 30 and the contact targets 320 on the wafer 300 mechanically and electrically contact with each other. Consequently, a signal path is established from the contact target 320 to test head of the semiconductor test system through the contactors 30 on the contactor carrier 40, pads and interconnect trace 54 of the space transformer 50, contact pads 62, 65, and interconnect trace 63 on the probe card 60, and pogo-pin block 130.

In the foregoing conventional example, to establish electrical connection with the contact pads of the semiconductor wafer, the probe contact system having many components has to be used, resulting in high cost. Since the semiconductor industry is under the continued demands of improving performances per cost, it is necessary to decrease the test cost involved in testing the semiconductor devices. Under the circumstances, there is a need in the industry to incorporate a simpler and more economical way to form a probe contact system for a semiconductor test system.

SUMMARY OF THE INVENTION

Therefore, it is an object of the present invention to provide a probe contact system to establish electrical connection with contact targets with a simple structure, low cost and high performance.

It is another object of the present invention to provide a probe contact system having a flexible printed circuit board, thereby eliminating the pogo-pin block, pogopins, coaxial cables, probe card and space transformer in the conventional technology.

It is a further object of the present invention to provide a probe contact system having a plurality of contactors made on a planar surface of a substrate in a two-dimensional manner and mounted on a carrier in a three-dimensional manner.

In one aspect of the present invention, the probe contact system includes: a main frame having an opening on a bottom at about a center thereof; a contactor carrier attached to the main frame, the contactor carrier mounting a plurality of contactors in a manner that lower ends of the contactors being projected from a lower surface of the contactor carrier through the opening of the main frame and top ends of the contactors being projected from an upper surface of the contactor carrier; a flexible printed circuit board having contact pads at a center area thereof and signal lines connected to the contact pads and extended to an end of the flexible printed circuit board, the center area of the flexible printed circuit board being mounted on the contactor carrier in a manner that the top ends of the contactors contacting with the contact pads on the flexible printed circuit board.

One of the essential features in the first aspect of the present invention resides in that each of the contactors has a top spring for resiliently contacting the top end with the contact pad on the flexible printed circuit board, and the end of the flexible printed circuit board with the signal lines is connected to a test head of the semiconductor test system.

Each contactor includes a stopper to position the contactor on the contactor carrier when the contactor is inserted in a through hole of the contactor carrier. The top spring of the contactor is provided between the top end and the stopper. Each of the contactors further comprises a main spring between a lower end and the stopper for producing a resilient contact force when the lower end is pressed against the contact target. The top spring is formed of a diagonal beam and the main spring is formed of a plurality of zig-zag shaped spring elements.

The flexible printed circuit board has two ends extended from the center area and connected to the test head of the semiconductor test system. Alternatively, the flexible printed circuit board has four ends extended from the center area and connected to the test head of the semiconductor test system. A pitch between two signal lines on the flexible printed circuit board at the contact center area is smallest and is enlarged toward the end of the flexible printed circuit board.

In the second aspect of the present invention, the probe contact system includes: a main frame having an opening on a bottom at about a center thereof; a contactor carrier attached to the main frame, the contactor carrier mounting a plurality of contactors in a manner that lower ends of the contactors being projected from a lower surface of the contactor carrier through the opening of the main frame and top ends of the contactors being projected from an upper surface of the contactor carrier; a conductive elastomer sheet provided on the contactor carrier in a manner that the top ends of the contactors contacting with a lower surface of the conductive elastomer sheet; a flexible printed circuit board having contact pads at a center area thereof and signal lines connected to the contact pads and extended to an end of the flexible printed circuit board, the center area of the flexible printed circuit board being provided on the conductive elastomer sheet in a manner that an upper surface of the conductive elastomer sheet contacting with the contact pads on the flexible printed circuit board.

One of the essential features in the second aspect of the present invention resides in that the top end of the contactor is electrically connected to the contact pad on the flexible printed circuit board through the conductive elastomer sheet, and the end of the flexible printed circuit board with the signal lines is connected to a test head of the semiconductor test system.

According to the present invention, the probe contact system has a simple structure by eliminating many components used in the conventional technology. Namely, by incorporating the flexible printed circuit board, the probe contact system of the present invention is established without using the pogo-pin block, pogo-pins, coaxial cables, probe card and space transformer in the conventional technology. The flexible printed circuit board has signal patterns and works as a space transformer by changing pitches of the contactors to the pitches of the socket in the test head. The flexible printed circuit board works as signal cables for connecting the contactors with the test head, thereby obviating the probe card, pogo-pins and coaxial cables in the conventional technology.

The probe contact system of the present invention has a broad bandwidth covering high frequency region to meet the test requirements of next generation semiconductor technology. Since a large number of contactors are produced at the same time on a substrate trough a semiconductor production process, it is possible to achieve consistent quality, high reliability and long life in the contactor performance as well as low cost. Further, according to the present invention, the production process is able to produce a large number of contactors in a horizontal direction on the silicon substrate by using relatively simple technique. Such contactors are mounted on a contactor carrier in a vertical direction. The probe contact system in the present invention is low cost, and has high efficiency, high mechanical strength and reliability.

BRIEF DESCRIPTION OF THE DRAWINGS

FIG. 10 is a schematic diagram showing another example of a probe contact system of the present invention using a conductive polymer sheet and contactors without having top springs.

DETAILED DESCRIPTION OF THE INVENTION

Examples of probe contact system of the present invention and examples of contactors for use in the probe contact system will be described with reference to FIGS. 4–13N. Although the present invention will be described for the case of testing a semiconductor wafer, the contact structure of the present invention can be used in testing LSI and VLSI chips, printed circuit boards and the like, or burning-in the semiconductor wafers and chips.

Figure 4:
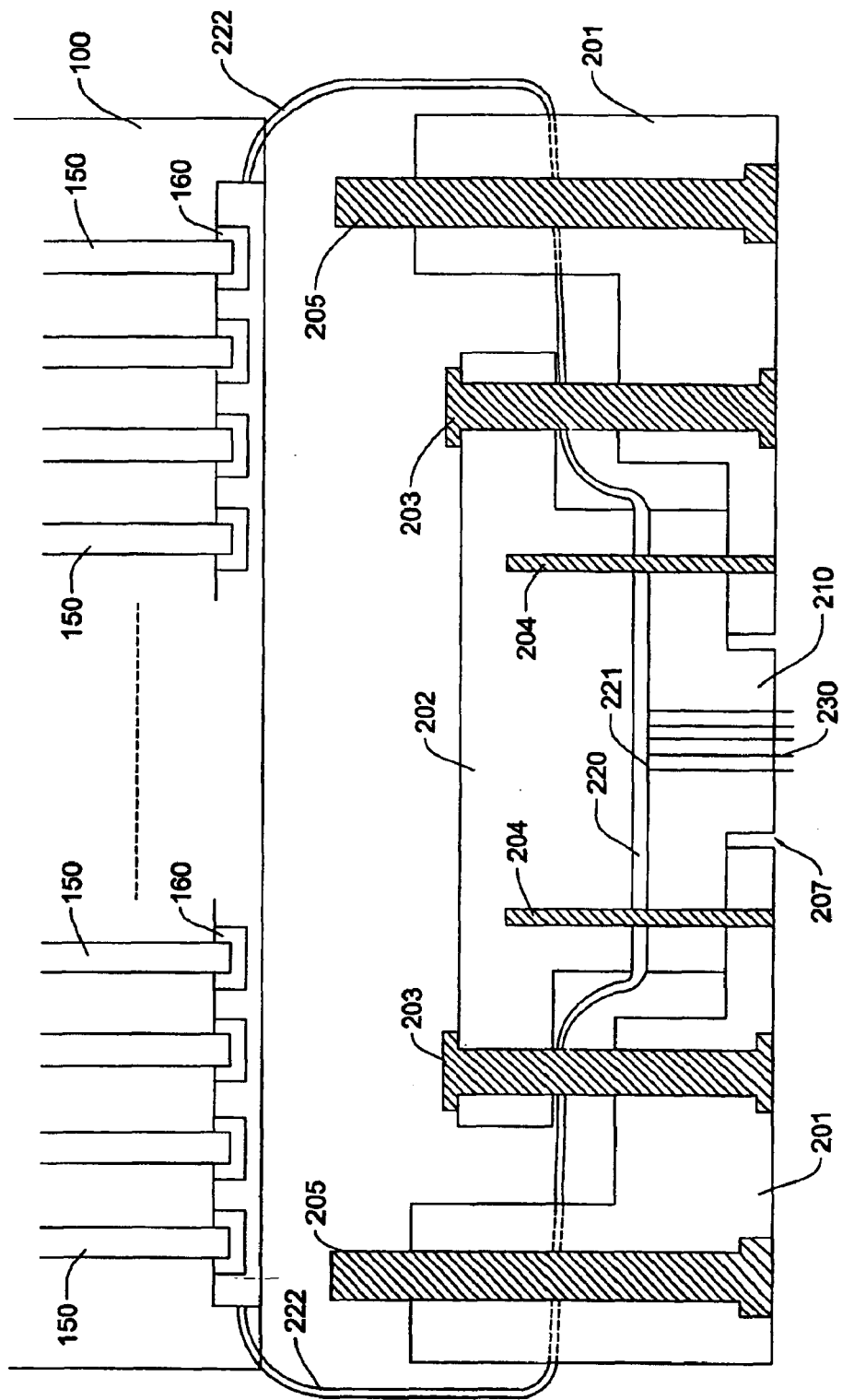
FIG. 4 is a schematic diagram showing an example of a probe contact system using a flexible printed circuit board in accordance with the present invention.

FIG. 4 is a cross sectional view of the probe contact system using the present invention. The test head 100 of the semiconductor test system is illustrated over the probe contact system. The probe contact system of FIG. 4 includes a main frame 201, a contactor carrier 210 mounted on a hollow portion of the main frame 201, a frame adaptor 202 for mounting the contactor carrier 210, and a flexible printed circuit board 220. A plurality of contactors 230 are mounted on the contactor carrier 210.

Figure 3:
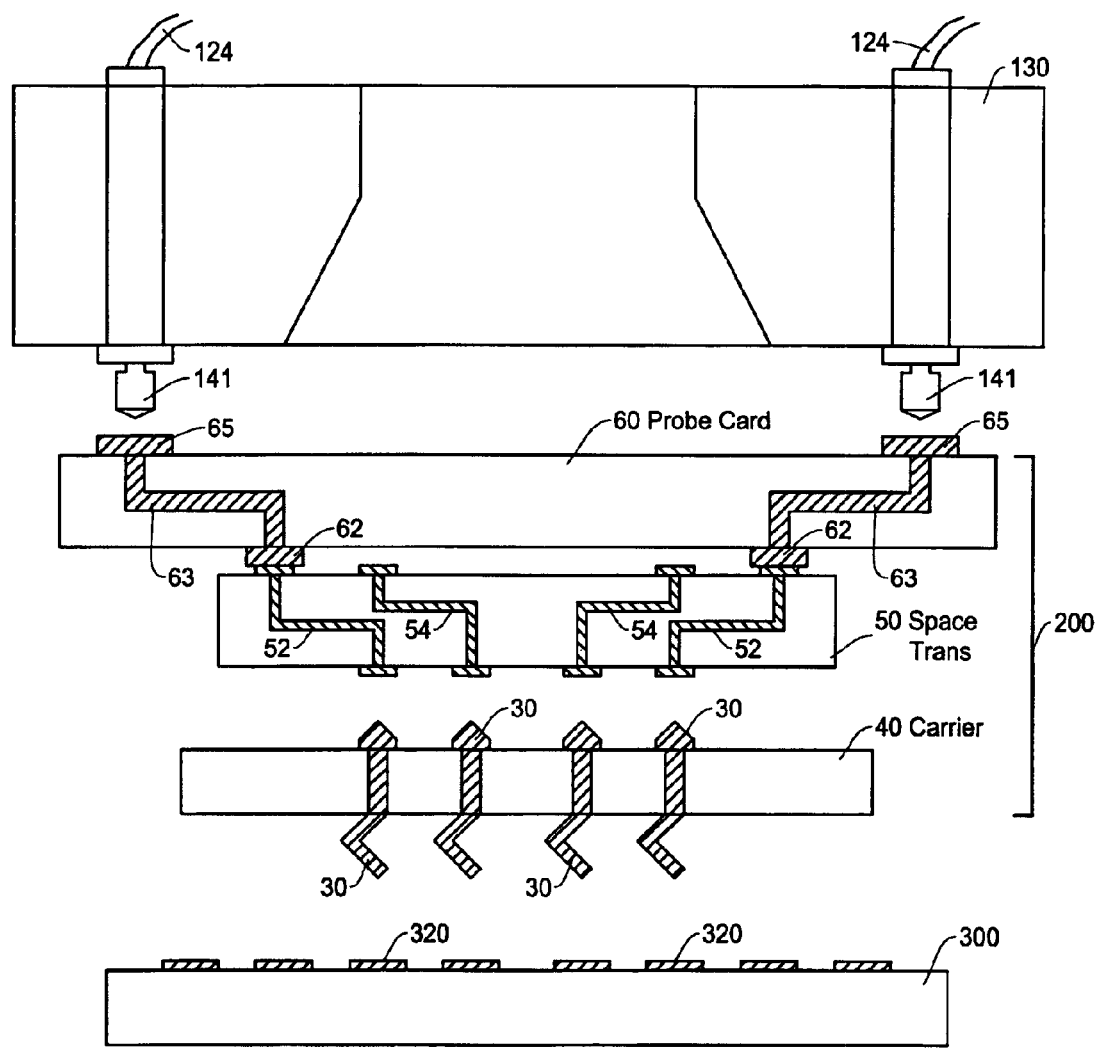
FIG. 3 is a cross sectional view showing an example of a probe contact system using the conventional contact structure for interfacing between the semiconductor device under test and the test head of the semiconductor test system.

In this example, the probe contact system has a structure which is much simpler than that of the conventional probe contact system such as shown in FIG. 3. Namely, the pogo-pins 141, probe card 60 and space transformer 50 in FIG. 3 are eliminated in the probe contact system of the present invention. Instead of such components used in the conventional technology, the probe contact system of FIG. 4 utilizes the flexible printed circuit board (hereafter "flexible PCB") 220.

The flexible PCB 220 plays an important role to cover the functions of the pogo-pins 141, coaxial cables 124, probe card 60, and the space transformer 50 in the conventional technology. In the present invention, the flexible PCB 220 transforms the space (pitch) and directly communicates with the PCB boards (pin cards) 150 in the test head 100 through the connectors 160. As a result, the probe contact system is able to dramatically reduce the cost because the probe card 60, pogo-pins 141, and the space transformer 50 are relatively expensive.

Figure 1:
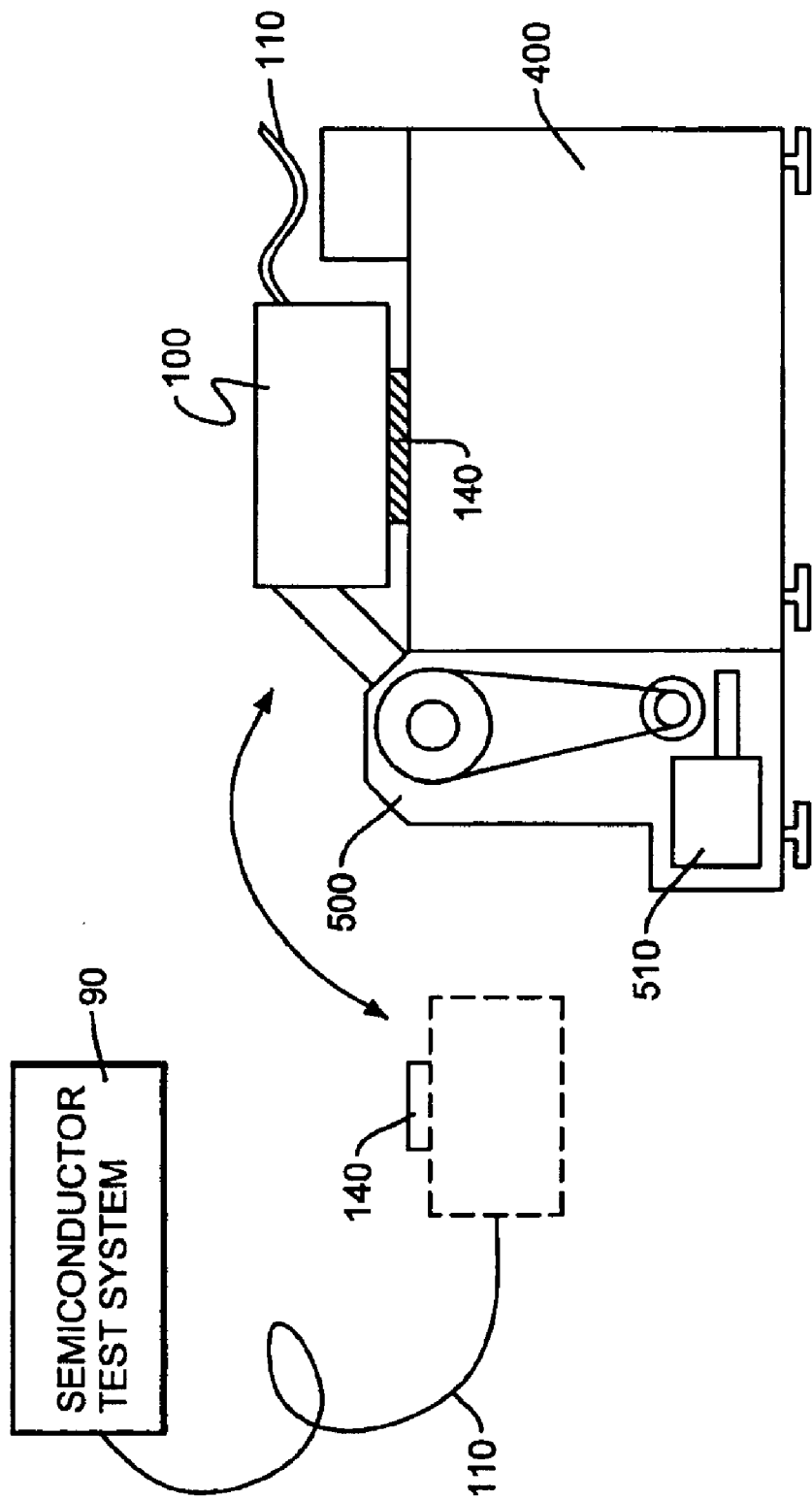
FIG. 1 is a schematic diagram showing a structural relationship between a substrate handler and a semiconductor test system for testing semiconductor devices.
Figure 2:
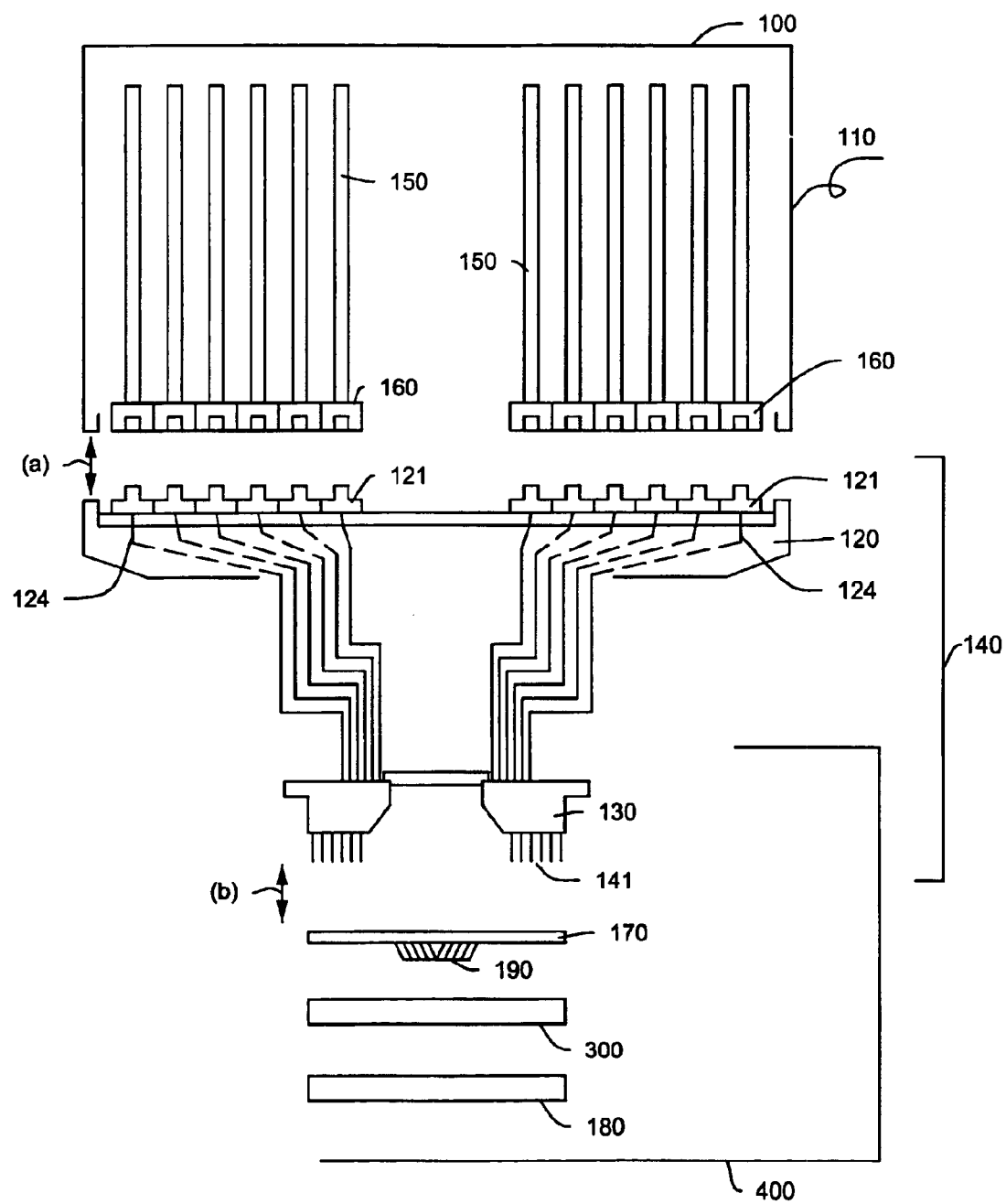
FIG. 2 is a schematic diagram showing an example of structure including a conventional probe contact system for connecting the test head of the semiconductor test system to the substrate handler.

The main frame 201 has, for example, a circular shape on which an opening 207 is formed at about a center bottom thereof for the contactors 230 to project from the bottom surface of the main frame 201 and the contactor carrier 210. The main frame 201 is attached to a substrate handler, such as an automatic wafer prober or an automatic test handler in a manner shown in FIG. 1 through screws (bolts) 205. The screws 205 can be differential screws or equivalent thereof to adjust the planarity of the top ends of the contactors 230 relative to the contact targets.

The contactor carrier 210 is mounted on the main frame 201 through the frame adaptor 202. In this example, screws (bolts) 203 are used to fix the frame adaptor 202 to the main frame 201 while the contactor carrier 210 is clamped therebetween. Preferably, alignment pins 204 are used to align the relative positions among the main frame 201, frame adaptor 202, flexible PCB 220, and the contactor carrier 210. The flexible PCB 220 is sandwiched between the frame adapter 202 and the contactor carrier 210 at about the center thereof.

Figure 5A:
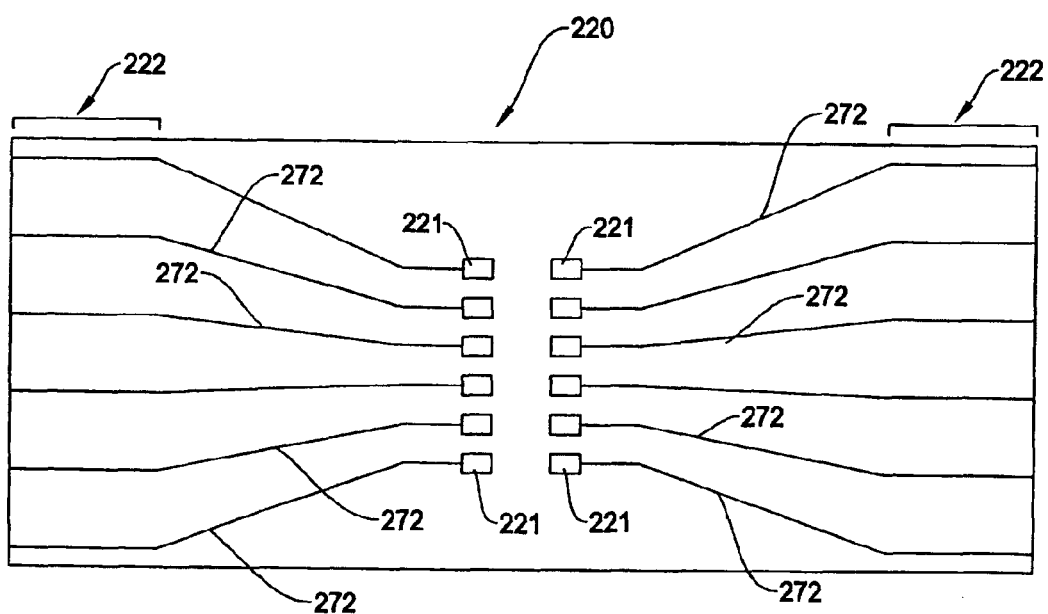
FIGS. 5A and 5B are schematic plan views showing examples of the flexible printed circuit board incorporated in the probe contact system of FIG. 4.
Figure 5B:
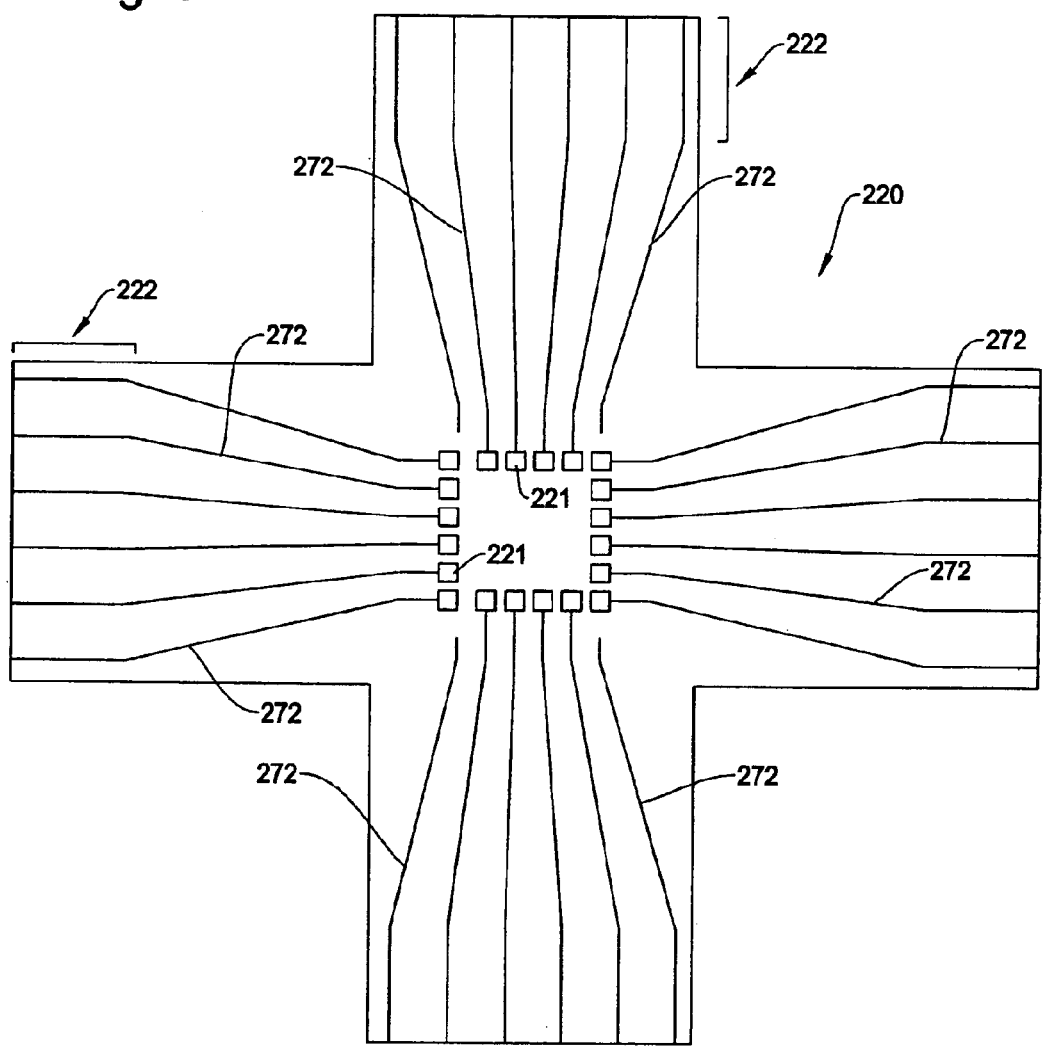

FIGS. 5A and 5B are plan views showing examples of the flexible PCB 220 incorporated in the probe contact system of the present invention. In the example of FIG. 5A, the flexible PCB 220 is extended in two directions, and in the example of FIG. 5B, the flexible PCB 220 is extended in four directions. The flexible PCB 220 has a plurality of contactor bases (contact pads) 221 at a center area and signal lines 272 connected to the contact pads and extended to the ends of the flexible PCB. The head of each contactor 230 contacts with the corresponding contact pad 221 on the flexible PCB 220 as shown in FIG. 4. In an actual application, a cable portion 222 of the flexible PCB 220 is longer than that shown in the drawings. The cable portions 222 are extended to the test head 100 of the semiconductor test system as shown in FIG. 4.

The flexible PCB 220 is typically made of polyimide, polyester or epoxy woven fiberglass. The flexible PCB 220 is either single sided or double sided and typically covered by an insulation layer while the contact pads 221 are exposed at the bottom surface of the flexible PCB 220. The signal lines 272 on the flexible PCB 220 are made of conductive materials such as nickel, copper or gold on the surface thereof or between two polyimide layers. As noted above, the cable portions 222 are directly connected to the test head 100 of the semiconductor test system.

The signal lines 272 change the small pitch of the contactors 230 and the contact pads 221 to the pitch of the socket 160 on the test head 100 which is much larger than that of the contactors. Namely, a pitch (distance) between two signal lines 272 at the contact pads 221 is smallest and is enlarged toward the end of the flexible PCB 200. In other words, the flexible PCB 220 in the probe contact system works as the space transformer, pogo-pins and coaxial cables in the conventional technology.

Figure 6:
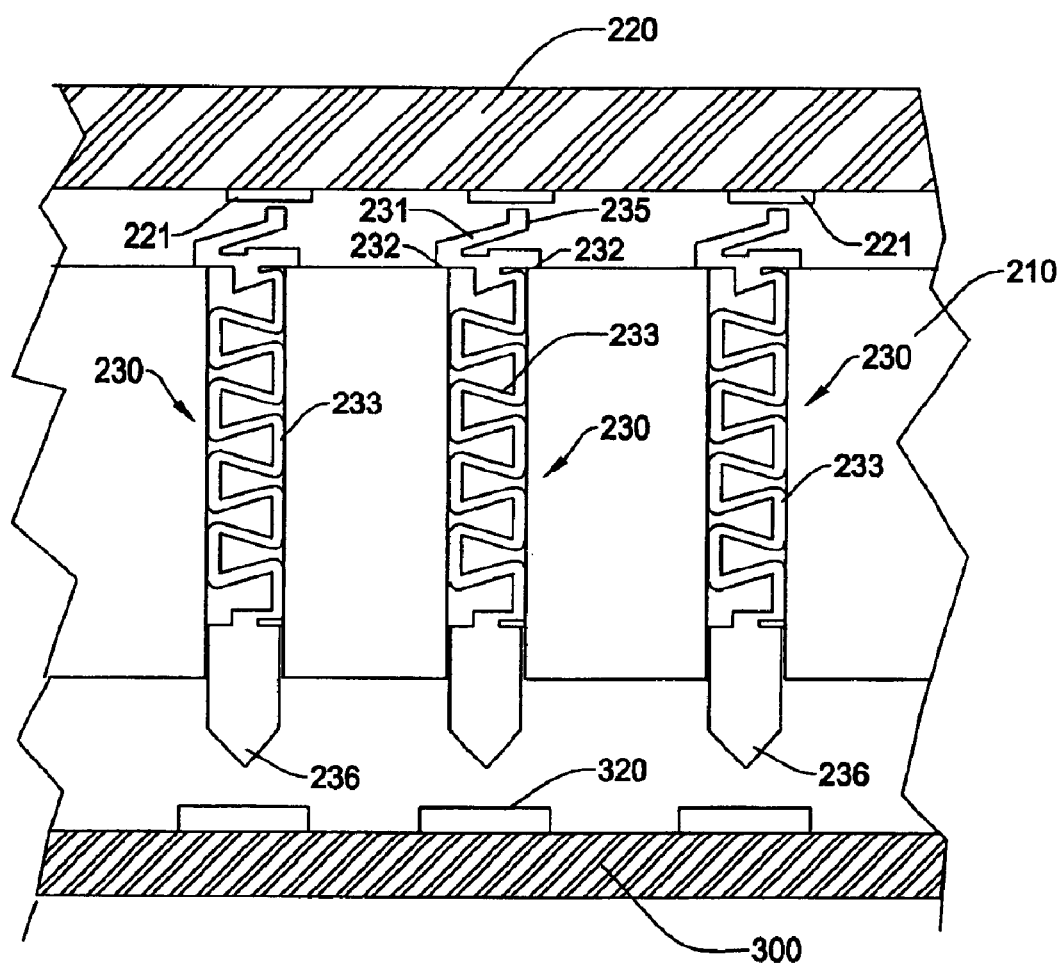
FIG. 6 is a partial cross sectional view showing an example of the probe contact system of the present invention using the flexible printed circuit board of FIGS. 5A–5B.

FIG. 6 is a partial cross sectional view of the probe contact system of the present invention showing the flexible PCB 220, the contactors 230 mounted on the contactor carrier 210 and the semiconductor wafer 300 under test. As shown in FIGS. 5A and 5B, the flexible PCB 220 has a plurality of contact pads 221 which contact with the top ends of the contactors 230. The semiconductor wafer 300 under test has a plurality of contact pads (contact targets) 320 which are probed by the contactors 230.

The contactor 230 has a top end 235 which contacts with the contact pad 221 on the flexible PCB 220, a top spring 231 formed of a diagonal beam, a stopper 232 which engages with the contactor carrier 210, a main spring 233, and a lower end 236 which is a contact point. Each of the contactors 230 is inserted in a through hole of the contactor carrier 210. The top end 235 and the top spring 231 are projected from the top surface of the contactor carrier 210. The main spring 233 is formed of a plurality of zig-zag shaped spring elements and is substantially encapsulated by the through hole of the contactor carrier 210 and the lower end 236 is projected from the bottom surface of the contactor carrier 210.

The stopper 232 of the contactor 230 is larger than the dimension of the through hole to engage with the upper surface of the contactor carrier 210. The stopper 232 is provided to securely mount the contactor 230, and at the same time, to keep the height of the upper end 235 of each contactor constant. The top spring 231 produces a resilient contact force when the top end 235 is pressed against the contact pad 221. The main spring 233 is configured by several spring elements and produces a resilient contact force when the lower end 236 is pressed against the contact pad 320 on the semiconductor wafer 300 under test. The resiliency of the contactor 230 promotes a scrubbing effect that occurs at the contact point in which the oxide layer is pierced by the contactors to promote a high connection performance.

As an example of the size of the contactor 230, a thickness is 30–50 micrometer, a width is 150–200 micrometer, and an overall length is 800–1,600 micrometer. As noted above, the stopper 232 has a size larger than the other part of the contactor so that the contactor 230 is stopped when the stopper 232 engages with the surface of the contactor carrier 210. The upper end 235 and lower end 236 of the contactor 230 function as contact points to establish electrical communication with other components. In the semiconductor test application, the upper end 235 contacts with the contact pad 221 on the flexible PCB 220, and the lower end 236 contacts with the contact pad 320 on the semiconductor wafer 300 under test.

Figure 7A:
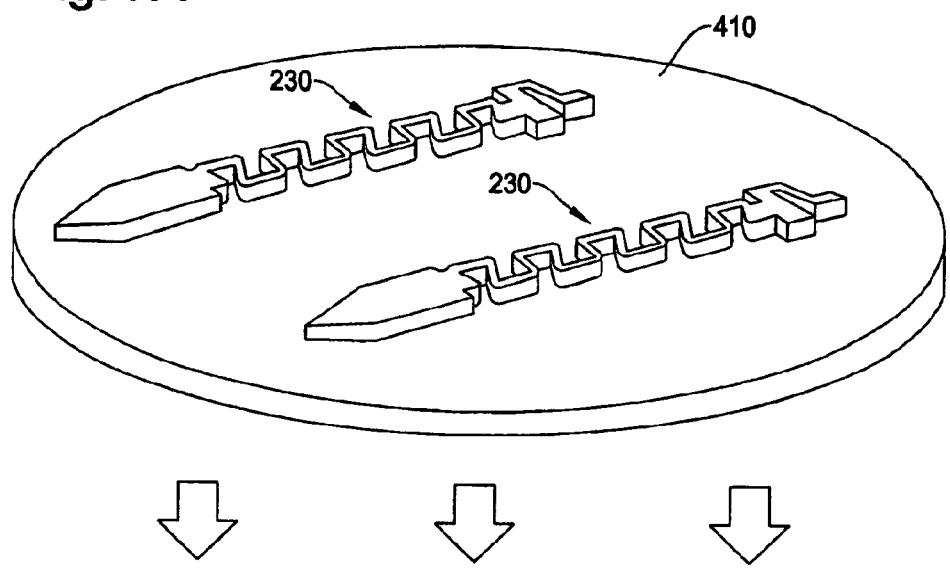
FIGS. 7A–7B are schematic diagrams showing a basic concept for producing the contactors of the present invention in which a large number of contactors are formed on a planar surface of a substrate and removed therefrom for being mounted on the contactor carrier.
Figure 7B:
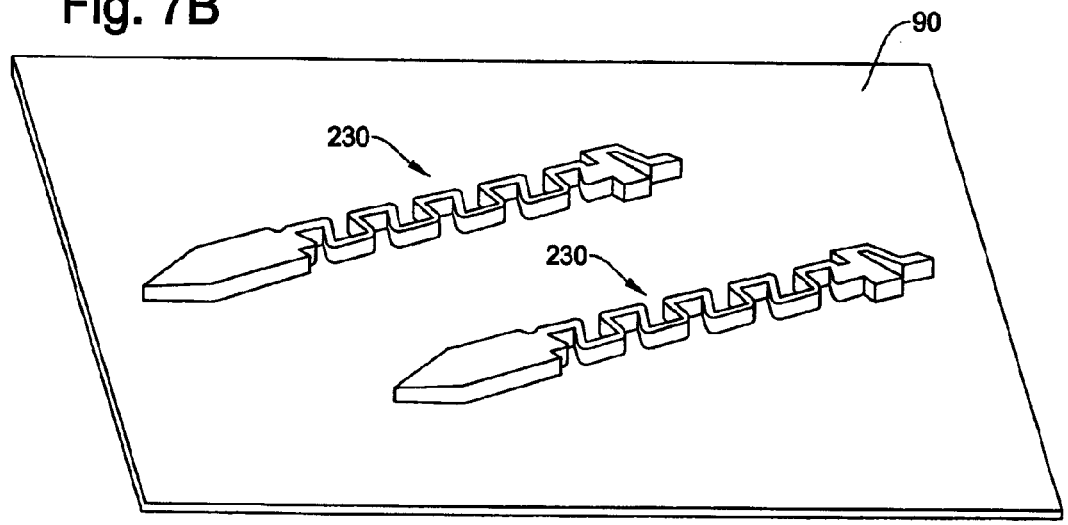

FIGS. 7A–7B show a basic concept for producing the contactors 230 of the present invention. As shown in FIG. 7A, the contactors 230 are produced on a planar surface of a substrate 410 in a horizontal direction, i.e., in parallel with a planar surface of the substrate 410. In other words, the contactors 230 are built in a two dimensional manner on the substrate 410. Then, the contactors 230 are removed from the substrate 410 and mounted on the contactor carrier 210 as shown in FIGS. 4 and 6 in a vertical direction, i.e. in a three dimensional manner. Typically, the substrate 410 is a silicon substrate although other types of substrate are also feasible.

In the example of FIG. 7B, after producing the contactors 230 on the planar surface of the substrate 410, the contactors 230 are transferred from the substrate 410 to an adhesive member 90, such as an adhesive tape or plate. Then, in the further process, the contactors 230 on the adhesive tape 90 are removed therefrom to be mounted on the contactor carrier 210 of FIGS. 4 and 6 in a vertical direction, i.e., in a three dimensional manner with use, for example, of a pick and place mechanism.

Figure 8A:
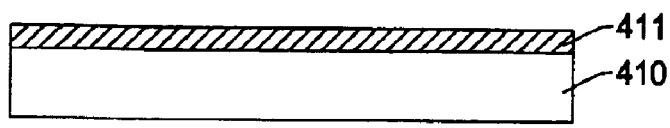
FIGS. 8A–8L are schematic diagrams showing an example of production process for producing the contactors of the present invention on a planar surface of a substrate in a two dimensional manner.

FIGS. 8A–8L are schematic diagrams showing an example of production process for producing the contactors of the present invention. In FIG. 8A, a sacrificial layer 411 is formed on a base substrate 410 which is typically a silicon substrate. Other substrate is also feasible such as a glass substrate, a ceramic substrate or other dielectric substrate. The sacrificial layer 411 is made, for example, of silicon dioxide ($SiO_2$) through a deposition process such as a chemical vapor deposition (CVD). The sacrificial layer 411 is to separate the contactors from the silicon substrate 410 in the later stage of the production process.

Figure 8B:
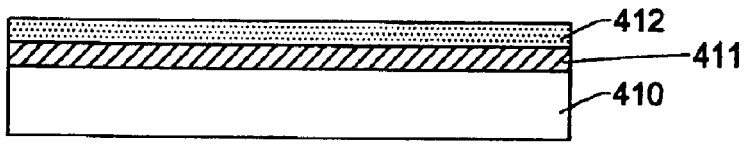
Figure 8C:
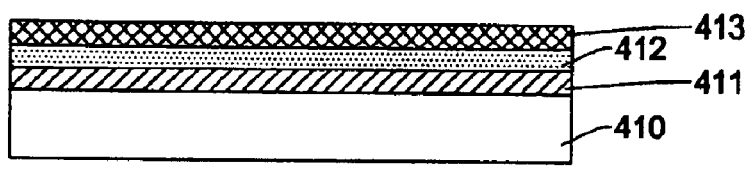

An adhesion promoter layer 412 is formed on the sacrificial layer 411 such as shown in FIG. 8B through, for example, an vapor process. An example of material for the adhesion promoter layer 412 includes chromium (Cr) and titanium (Ti) with the thickness of about 200–1,000 angstroms, for example. The adhesion promoter layer 412 is to facilitate the adhesion of conductive layer 413 of FIG. 8C on the silicon substrate 410. The conductive layer 413 is made, for example, of copper (Cu) or Nickel (Ni), with a thickness of about 1,000–5,000 angstroms, for example. The conductive layer 413 is to establish electrical conductivity for an electroplating process in the later stage.

Figure 8D:
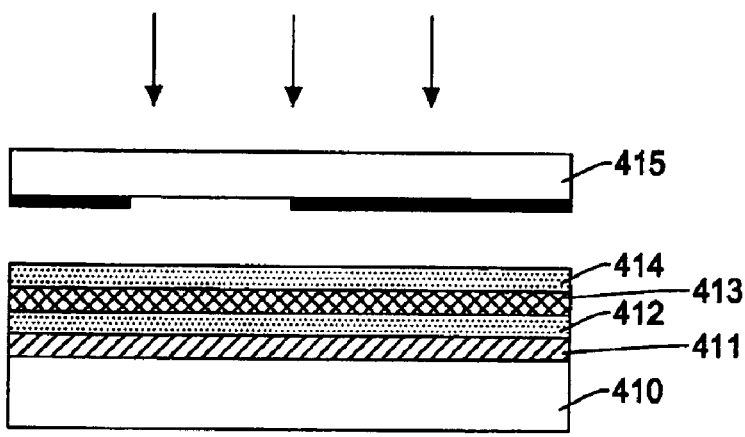

In the next process, a photoresist layer 414 is formed on the conductive layer 413 over which a photo mask 415 is precisely aligned to be exposed with ultraviolet (UV) light as shown in FIG. 8D. The photo mask 415 shows a two dimensional image of the contactor which will be developed on the photoresist layer 413. As is well known in the art, positive as well as negative photoresist can be used for this purpose. If a positive acting resist is used, the photoresist covered by the opaque portion of the mask 415 hardens (cure) after the exposure. In the development process, the exposed part of the resist can be dissolved and washed away, leaving a photoresist layer 414 of FIG. 8E having an opening or pattern "A" on the photoresist layer 414 having the image (shape) of the contactor 230. FIG. 8F shows a plan view of the pattern "A" on the substrate showing the shape of the contactor 230.

Figure 8E:
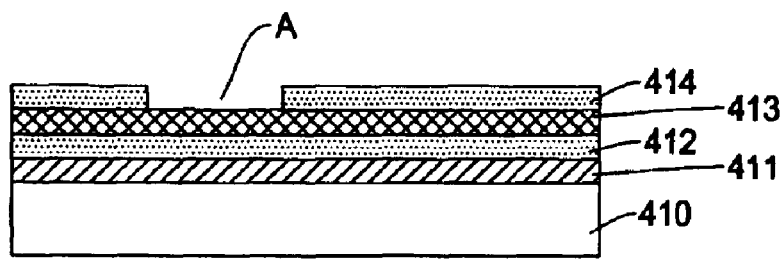
Figure 8F:
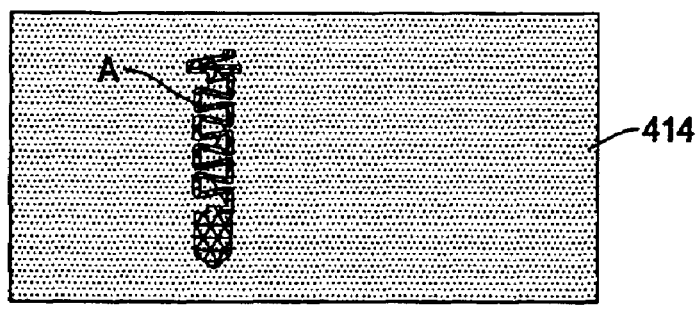

In the photolithography process in the foregoing, instead of the UV light, for creating the pattern "A" shown in FIGS. 8E and 8F, it is also possible to expose the photoresist layer 414 with an electron beam or X-rays as is known in the art. Further, it is also possible to directly write the image of the contact structure on the photoresist layer 414 by exposing the photoresist 414 with a direct write electron beam, X-rays or light source such as a laser.

Figure 8G:
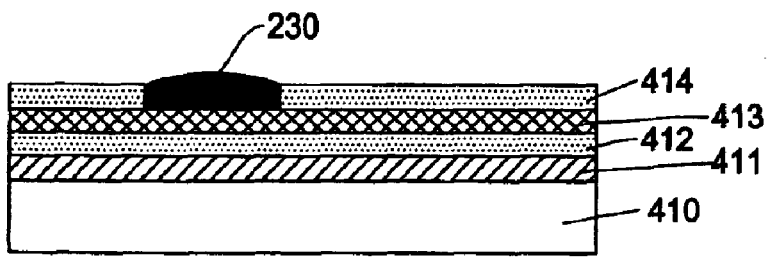
Figure 8H:
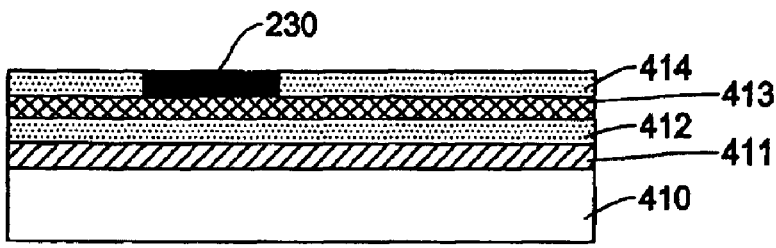

The conductive material such as copper (CU), nickel (Ni), aluminum (Al), rhodium (Rh), palladium (Pd), tungsten (w)

or other material, nickel-cobalt (NiCo) or other alloy combinations thereof is deposited (electroplated) in the pattern "A" of the photoresist layer 414 to form the contactor 230 as shown in FIG. 8G. Preferably, a conductive material which is different from that of the conductive layer 413 should be used to differentiate etching characteristics from one another as will be described later. The over plated portion of the contactor 230 in FIG. 8G is removed in the grinding (planarizing) process of FIG. 8H.

Figure 11:
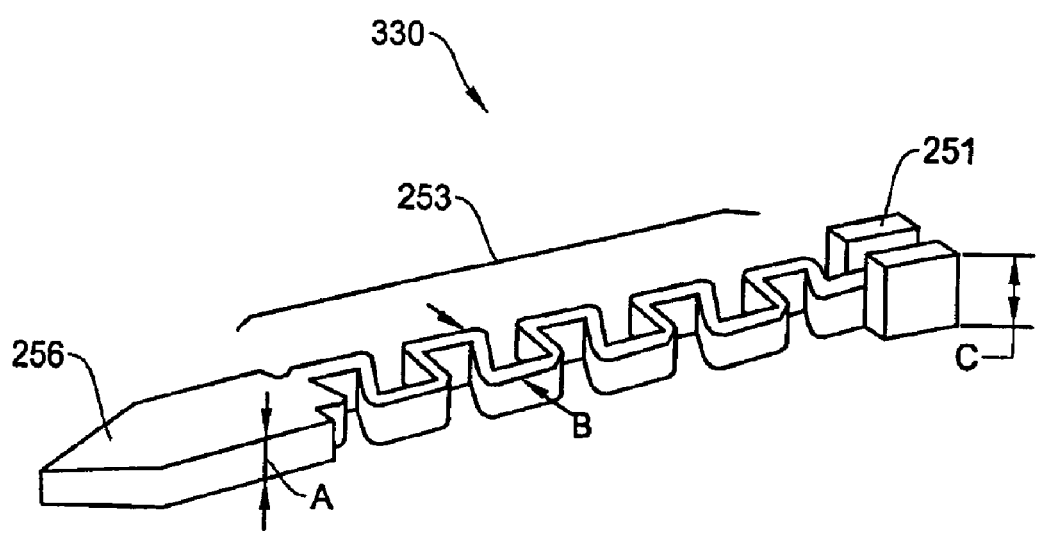
FIG. 11 is a perspective view showing another example of contactor of the present invention for use in the probe contact system of FIG. 10.

The above noted process may be repeated for producing contactors having different thickness by forming two or more conductive layers. For example, a certain portion of the contactor may be designed to have a thickness larger than that of the other portions. Such a contactor is shown in FIGS. 11 and 12B in which a top end portion 251 has a larger thickness than the other portions. In such a case, after forming a first layer of the contactors (conductive material), if necessary, the process of FIGS. 8D–8H will be repeated to form a second layer or further layers on the first layer of the contactors.

Figure 8I:
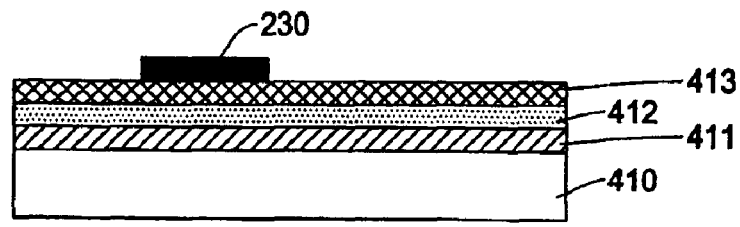
Figure 8J:
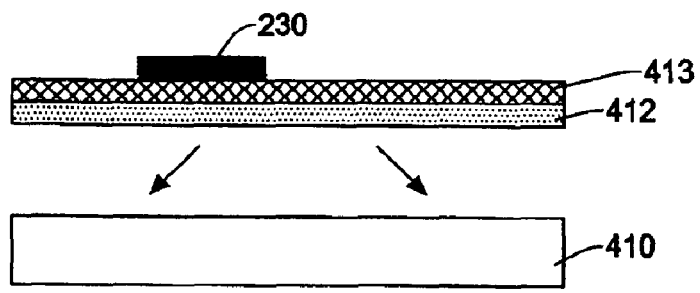
Figure 8K:
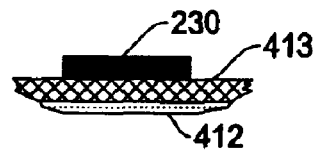
Figure 8L:
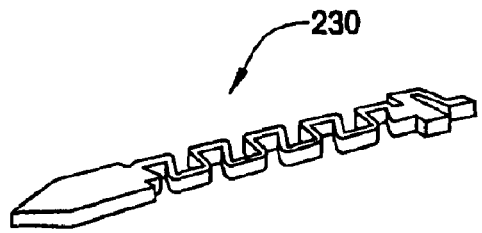

In the next process, the photoresist layer 414 is removed in a resist stripping process as shown in FIG. 8I. Typically, the photoresist layer 414 is removed by wet chemical processing. Other example of stripping methods includes acetone-based stripping and plasma $O_2$ stripping. In FIG. 8J, the sacrificial layer 411 is etched away so that the contactor 230 is separated from the base substrate 410. Another etching process is conducted so that the adhesion promoter layer 412 and the conductive layer 413 are removed from the contactor 230 as shown in FIG. 8K.

The etching condition can be selected to etch the layers 412 and 413 but not to etch the contactor 230. In other words, to etch the conductive layer 413 without etching the contactor 230, as noted above, the conductive material used for the contactor must be different from the material of the conductive layer 413. Finally, the contactor 230 is separated from any other materials as shown in the prospective view of FIG. 8L. Although the production process in FIGS. 8A–8L shows only one contactor 230, in an actual production process, a large number of contactors are produced at the same time through the foregoing process.

Figure 9A:
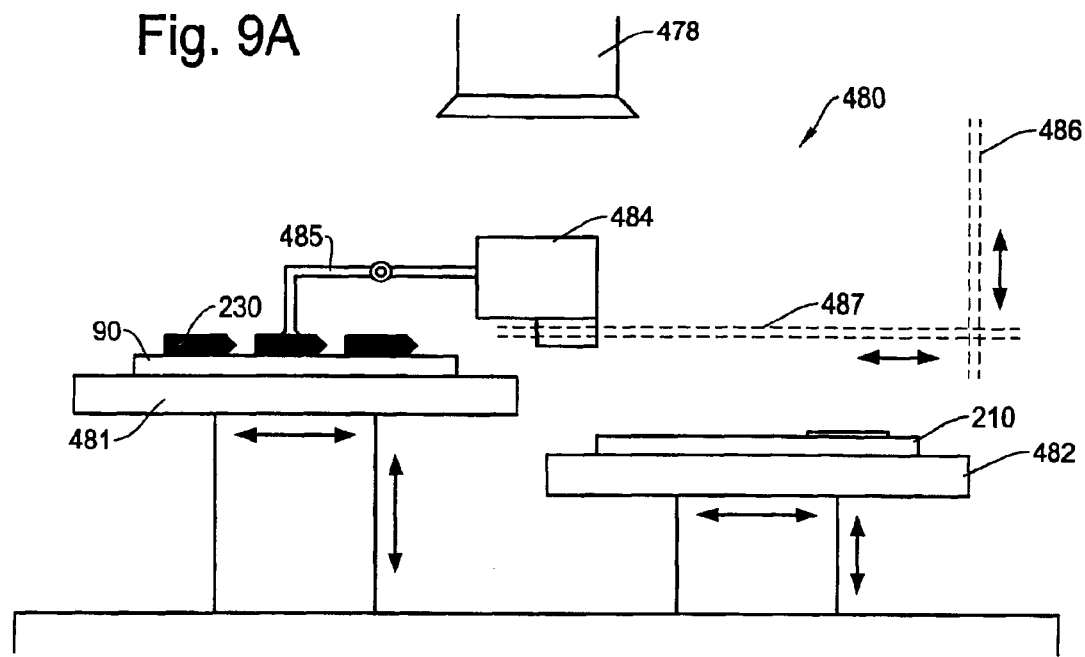
FIGS. 9A–9B are schematic diagrams showing an example of pick and place mechanism and its process for picking the contactors and placing the same on the contactor carrier to establish the probe contact system of the present invention.
Figure 9B:
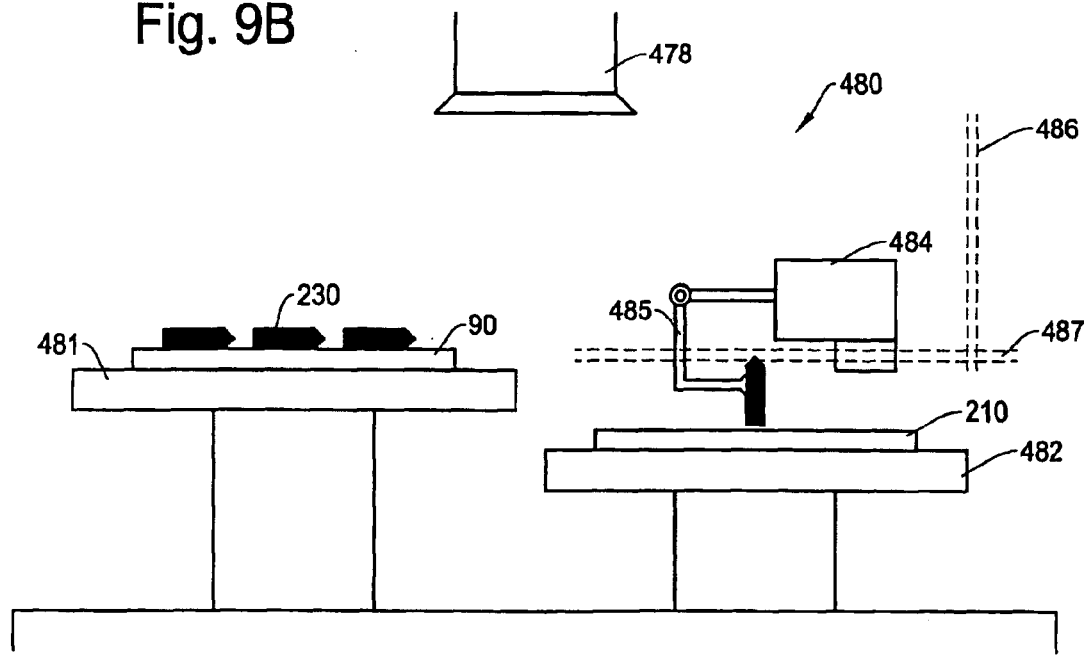

FIGS. 9A and 9B are schematic diagrams showing an example of process for picking the contactors 230 from the adhesive tape 90 and placing the contactors on the contactor carrier 210. The pick and place mechanism of FIGS. 9A and 9B is advantageously applied to the contactors 230 produced by the production process involving the adhesive tape 90 as shown in FIG. 7B. FIG. 9A is a front view of the pick and place mechanism 480 showing the first half process of the pick and place operation. FIG. 9B is a front view of the pick and place mechanism 480 showing the second half process of the pick and place operation.

In this example, the pick and place mechanism 480 is comprised of a transfer mechanism 484 to pick and place the contactors 230, mobile arms 486 and 487 to allow movements of the transfer mechanism 480 in X, Y and Z directions, tables 481 and 482 whose positions are adjustable in X, Y and Z directions, and a monitor camera 478 having, for example, a CCD image sensor therein. The transfer mechanism 484 includes a suction arm 485 that performs suction (pick operation) and suction release (place operation) operations for the contactors 230. The suction force is created, for example, by a negative pressure such as vacuum. The suction arm 485 rotates in predetermined angle such as 90 degrees.

In operation, the adhesive tape 90 having the contactors 230 and the contactor carrier 210 having the through holes are positioned on the respective tables 481 and 482 on the pick and place mechanism 480. As shown in FIG. 9A, the transfer mechanism 480 picks the contactors 230 from the adhesive tape 90 by the suction force of the suction arm 485. After picking the contactors 230, the suction arm 485 rotates by 90 degrees, for example, as shown in FIG. 9B. Thus, the orientation of the contactor 230 is changed from the horizontal direction to the vertical direction. This operation change mechanism is just an example, and a person skilled in the art knows that there are many ways to change the orientation of the contactors. The transfer mechanism 480 then places the contactor 230 on the contactor carrier 210 where the contactors 230 are inserted in the through holes.

FIG. 10 is a cross sectional view showing another example of the probe contact system of the present invention using another type of the contactor. In this example, a conductive elastomer 240 is used between the flexible PCB 220 and the contactor carrier 210. A plurality of contactors 330 are mounted on the contactor carrier 210. In this embodiment, the contactor 330 does not have a spring at the top end. However, the conductive elastomer 240 establishes the elasticity to securely connect between the top end of the contactor 330 and the flexible PCB 220. Other than the contactors 330 and the conductive elastomer 240, the structure of the probe contact system of FIG. 10 is basically the same as that shown in FIG. 4.

FIG. 11 shows a perspective view of the contactor 330 used in the probe contact system of FIG. 10. The contactor 330 is configured by a top end 251, a main spring 253 and a lower end 256. As noted above, the contactor 330 of FIG. 11 does not have a spring at the top. The top end 251 of the contactor 330 has a thickness greater than that of the other portions. For example, a thickness A of the main spring 253 and the lower end 256 is about 30–50 micrometer, a width B of the main spring and the lower end 256 is 150–200 micrometer, a thickness C of the top end 251 is 60–100 micrometer, and an overall length is 800–1,600 micrometer. As mentioned in the production process with reference to FIGS. 8A–8L, the increased thickness of the top end 251 is created by forming two or more conductive layers. The increased thickness of the top end 251 creates an increased contact area with respect to the conductive elastomer 240, thereby improving the contact performance.

Figure 12A:
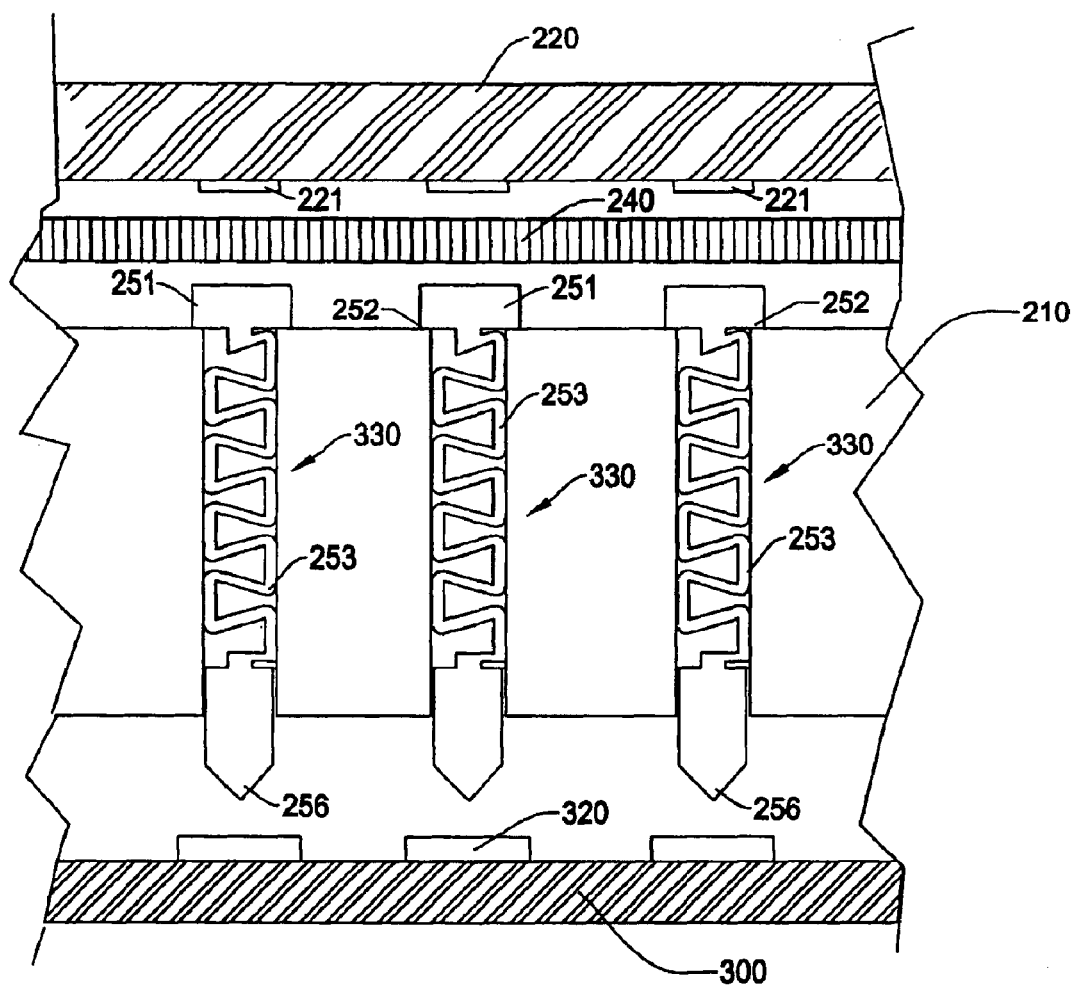
FIG. 12A is a partial cross sectional front view showing the probe contact system of FIG. 10.
Figure 12B:
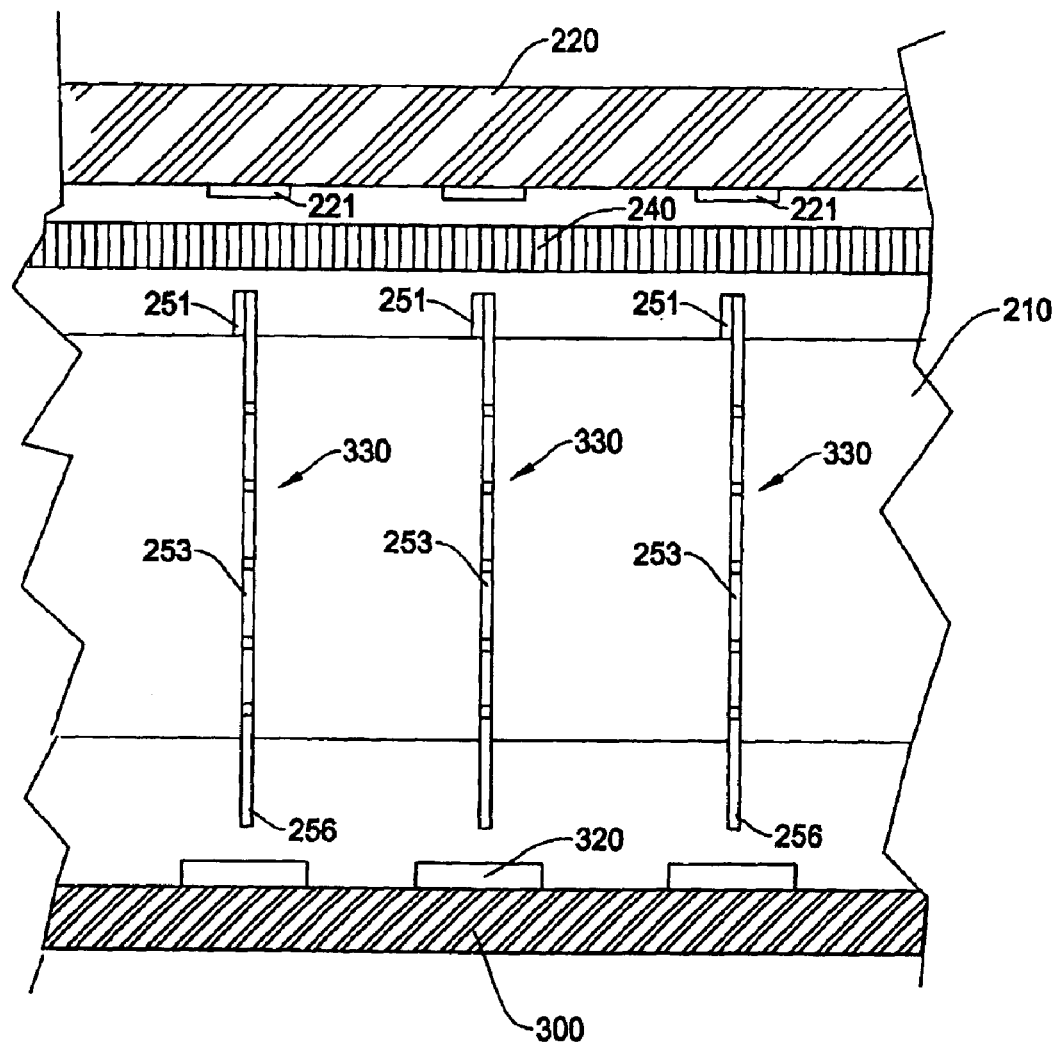
FIG. 12B is a partial cross sectional side view of the contact probe contact system of FIG. 10.

FIGS. 12A and 12B are partial cross sectional views showing the probe contact system of the present invention using the contactors shown in FIG. 11. FIG. 12A is a partial cross sectional front view, and FIG. 12B is a partial cross sectional side view of the contact probe contact system of FIG. 10. The probe contact system shows the flexible PCB 220, conductive elastomer 240, the contactors 330 mounted on the contactor carrier 210, and the semiconductor wafer 300.

As shown in FIGS. 12A and 12B, the contactor 330 is formed with the top end 251, a stopper 252, a main spring 253 and a lower end 256. The stopper 252 has a width larger than that of the through hole of the contactor carrier 210 to stop the contactor 330 when inserted in the through hole. The main spring 253 is enclosed with the through hole of the contactor carrier 210 and elastically moved in the through hole when the lower end 256 is pressed against the contact target. As shown in FIG. 12B, the top end 251 of the contactor 330 has a larger thickness which also functions as the stopper.

The conductive elastomer sheet 240 is an elastic sheet with unidirectional conductivity by having a large number of conductive wires in a direction vertical with a surface of the contactor carrier 210. The conductive elastomer sheet 240 is placed between the flexible PCB 220 and the contactor carrier 210 to establish electrical communication between the contact pads 221 and the top ends 251 of the contactor 330. The conductive elastomer sheet 240 ensures the electrical communication by its elasticity and conductivity at the top of the contactor 330. The main spring 253 ensures the electrical communication between the lower end 256 of the contactor 330 and the contact pads 320 on the semiconductor under test 300.

Figure 13A:
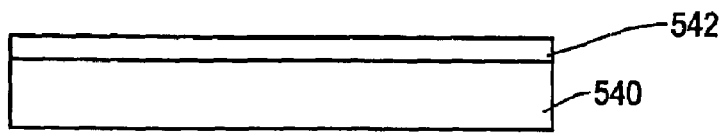
FIGS. 13A–13N are schematic diagrams showing another example of production process for producing the contactors of the present invention on a planar surface of a substrate in a two dimensional manner.
Figure 13B:
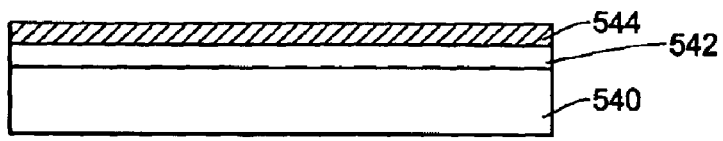
Figure 13C:
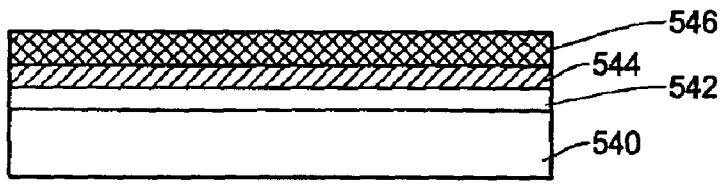
Figure 13D:
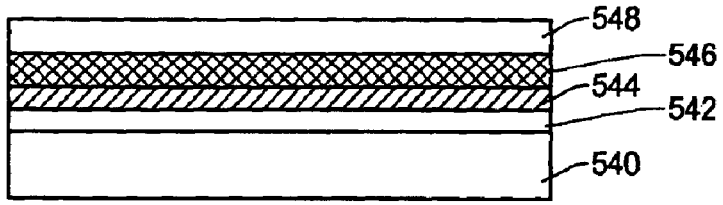
Figure 13E:
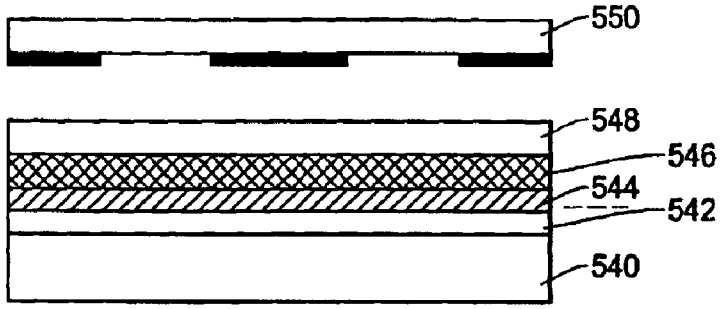
Figure 13F:
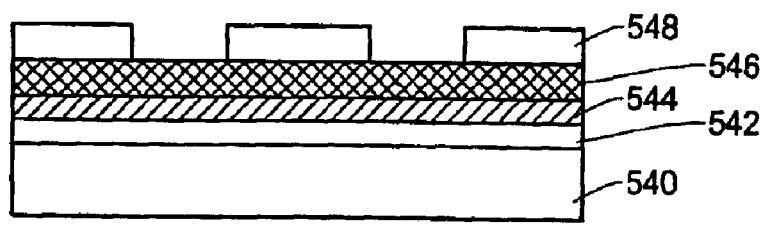
Figure 13G:
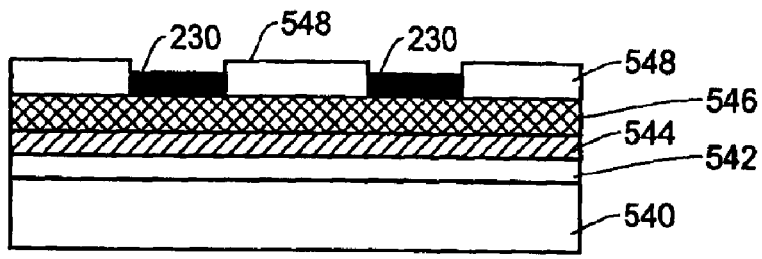
Figure 13H:
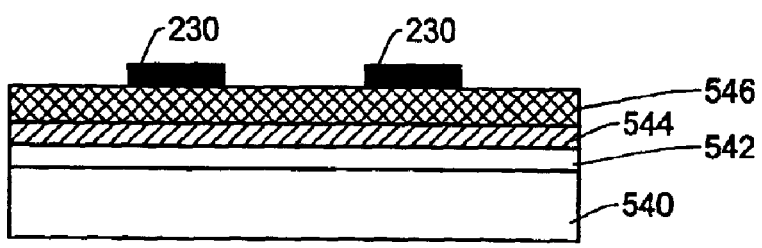
Figure 13I:
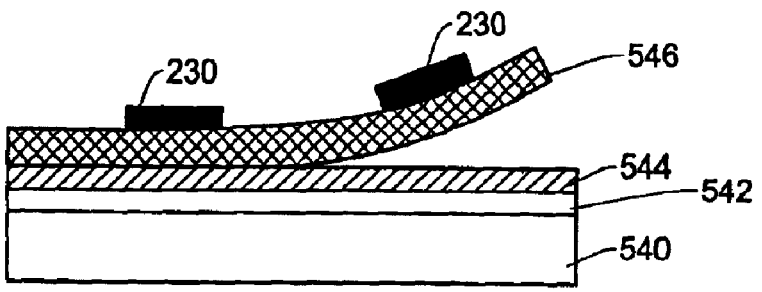
Figure 13J:
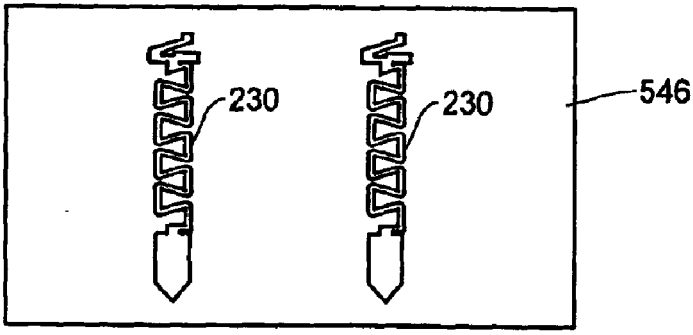
Figure 13K:
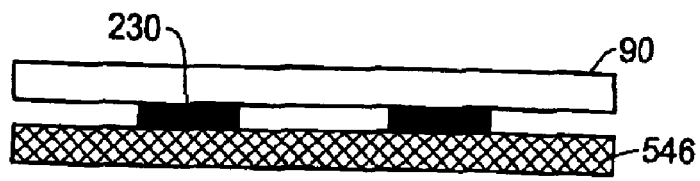
Figure 13L:
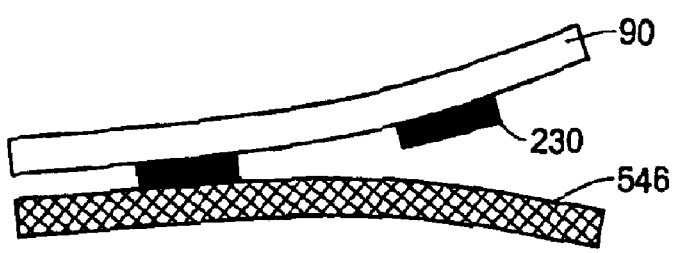
Figure 13M:
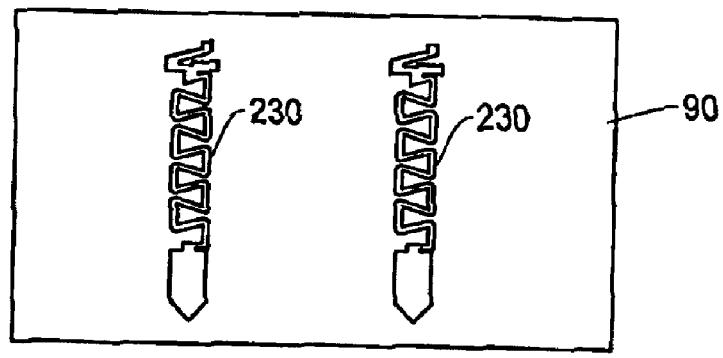
Figure 13N:
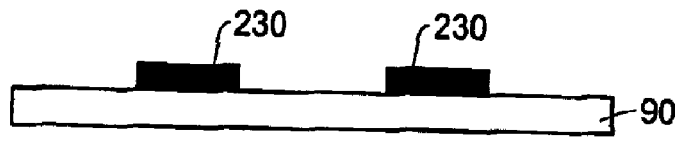

FIGS. 13A–13N are schematic diagrams showing a, further example of production process for producing the contactors 230 and 330 where the contactors are transferred to the adhesive tape. In FIG. 13A, an electroplate seed (conductive) layer 542 is formed on a base substrate 540 which is typically a silicon or glass substrate. The seed layer 542 is made of, for example, copper (Cu) or nickel (Ni), with a thickness of about 1,000–5,000 angstrom, for example. A chrome-inconel layer 544 is formed on the seed layer 542 as shown in FIG. 13B through, for example, a sputtering process.

In the next process in FIG. 13C, a conductive substrate 546 is formed on the chrome-inconel layer 544. The conductive substrate 546 is made, for example, of nickel-cobalt (NiCo) with a thickness of about 100–130 micrometer. After passivating the conductive substrate 546, a photoresist layer 548 with a thickness of about 100–120 micrometer is formed on the conductive substrate 546 in FIG. 13D and a photo mask 550 is precisely aligned so that the photoresist layer 548 is exposed with ultraviolet (UV) light as shown in FIG. 13E. The photo mask 550 shows a two dimensional image of the contactor 230 which will be developed on the surface of the photoresist layer 548.

In the development process, the exposed part of the resist can be dissolved and washed away, leaving a photoresist layer 548 of FIG. 13F having a plating pattern transferred from the photo mask 550 having the image (shape) of the contactor 230. In the step of FIG. 13G, conductive material is electroplated in the plating pattern on the photoresist layer 548 with a thickness of about 50–60 micrometer. An example of the conductive material is nickel-cobalt (NiCo). The nickel-cobalt contactor material will not strongly adhere to the conductive substrate 546 made of nickel-cobalt.

In the case where the contactor has two or more different thickness, such as the contactor 330 shown in FIGS. 11 and 12B, the above noted process may be repeated for producing the contactor by forming two or more conductive layers. Namely, after forming a first layer of the contactors, if necessary, the processes of FIGS. 13D–13G are repeated to form a second layer or further layers on the first layer of the contactors.

In the next process, the photoresist layer 548 is removed in a resist stripping process as shown in FIG. 13H. In FIG. 13I, the conductive substrate 546 is peeled from the chrome-inconel layer 544 on the substrate 540. The conductive substrate 546 is a thin substrate on which the contactors 230 are mounted with a relatively weak adhesive strength. The top view of the conductive substrate 546 having the contactors 230 is shown in FIG. 13J.

FIG. 13K shows a process in which an adhesive tape 90 is placed on an upper surface of the contactors 230. The adhesive strength between the adhesive tape 90 and the contactors 230 is greater than that between the contactors 230 and the conductive substrate 546. Thus, when the adhesive tape 90 is removed from the conductive substrate 546, the contactors 230 are transferred from the conductive substrate 546 to the adhesive tape 90 as shown in FIG. 13L. FIG. 13M shows a top view of the adhesive tape 90 having the contactors 230 thereon and FIG. 13N is a cross sectional view of the adhesive tape 90 having the contactors 230 thereon.

As has been foregoing, according to the present invention, the probe contact system has a simple structure by eliminating many components used in the conventional technology. Namely, by incorporating the flexible printed circuit board, the probe contact system of the present invention is established without using the pogo-pin block, pogo-pins, coaxial cables, probe card and space transformer in the conventional technology. The flexible printed circuit board has signal patterns and works as a space transformer by changing pitches of the contactors to the pitches of the socket in the test head. The flexible printed circuit board works as signal cables for connecting the contactors with the test head, thereby obviating the probe card, pogo-pins and coaxial cables in the conventional technology.

The probe contact system of the present invention has a broad bandwidth covering high frequency region to meet the test requirements of next generation semiconductor technology. Since a large number of contactors are produced at the same time on a substrate trough a semiconductor production process, it is possible to achieve consistent quality, high reliability and long life in the contactor performance as well as low cost. Further, according to the present invention, the production process is able to produce a large number of contactors in a horizontal direction on the silicon substrate by using relatively simple technique. Such contactors are mounted on a contactor carrier in a vertical direction. The probe contact system in the present invention is low cost, and has high efficiency, high mechanical strength and reliability.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A probe contact system for establishing electrical connection between contact targets and a semiconductor test system, comprising:

a main frame having an opening on a bottom at about a center thereof;

a contactor carrier attached to the main frame, the contactor carrier mounting a plurality of contactors in a manner that lower ends of the contactors being projected from a lower surface of the contactor carrier through the opening of the main frame and top ends of the contactors being projected from an upper surface of the contactor carrier;

a flexible printed circuit board having contact pads at a center area thereof and signal lines connected to the contact pads and extended to an end of the flexible printed circuit board, the center area of said flexible printed circuit board being mounted on the contactor carrier in a manner that the top ends of the contactors contacting with the contact pads on the flexible printed circuit board;

wherein each of said contactors has a top spring for resiliently contacting the top end with the contact pad on the flexible printed circuit board, and wherein the end of said flexible printed circuit board with said signal lines is connected to a test head of the semiconductor test system;

wherein each of the contactors includes a stopper to position the contactor on the contactor carrier when the contactor is inserted in a through hole of the contactor carrier;

wherein said top spring of the contactor is provided between the top end and the stopper, and wherein each of the contactors further comprises a main spring between a lower end and the stopper for producing a resilient contact force when the lower end is pressed against the contact target.

2. A probe contact system as defined in claim 1, further comprising a frame adaptor which is attached to the main frame to hold the flexible printed circuit board between the contactor carrier and the frame adaptor.

3. A probe contact system as defined in claim 1, wherein said top spring is formed of a diagonal beam and said main spring is formed of a plurality of zig-zag shaped spring elements.

4. A probe contact system as defined in claim 1, wherein said flexible printed circuit board has two ends extended from the center area and connected to the test head of the semiconductor test system.

5. A probe contact system as defined in claim 1, wherein said flexible printed circuit board has four ends extended from the center area and connected to the test head of the semiconductor test system.

6. A probe contact system as defined in claim 1, wherein a pitch between two signal lines on the flexible printed circuit board at the contact center area is smallest and is enlarged toward the end of the flexible printed circuit board.

7. A probe contact system for establishing electrical connection between contact targets and a semiconductor test system, comprising:

a main frame having an opening on a bottom at about a center thereof;

a contactor carrier attached to the main frame, the contactor carrier mounting a plurality of contactors in a manner that lower ends of the contactors being projected from a lower surface of the contactor carrier through the opening of the main frame and top ends of the contactors being projected from an upper surface of the contactor carrier;

a conductive elastomer sheet provided on the contactor carrier in a manner that the top ends of the contactors contact with a lower surface of the conductive elastomer sheet;

a flexible printed circuit board having contact pads at a center area thereof and signal lines connected to the contact pads and extended to an end of the flexible printed circuit board, the center area of said flexible printed circuit board being provided on the conductive elastomer sheet in a manner that an upper surface of the conductive elastomer sheet contacting with the contact pads on the flexible printed circuit board;

wherein the top end of the contactor is electrically connected to the contact pad on the flexible printed circuit board through the conductive elastomer sheet, and wherein the end of said flexible printed circuit board with said signal lines is connected to a test head of the semiconductor test system;

wherein each of the contactors includes a stopper to position the contactor on the contactor carrier when the contactor is inserted in a through hole of the contactor carrier; and wherein each of the contactors further comprises a main spring between a lower end and the stopper for producing a resilient contact force when the lower end is pressed against the contact target.

8. A probe contact system as defined in claim 7, further comprising a frame adaptor which is attached to the main frame to hold the conductive elastomer sheet and the flexible printed circuit board between the contactor carrier and the frame adaptor.

9. A probe contact system as defined in claim 7, wherein the top end of the contactor has a thickness which is greater than that of other parts of the contactor.

10. A probe contact system as defined in claim 7, wherein said main spring is formed of a plurality of zig-zag shaped spring elements.

11. A probe contact system as defined in claim 7, wherein said flexible printed circuit board has two ends extended from the center area and connected to the test head of the semiconductor test system.

12. A probe contact system as defined in claim 7, wherein said flexible printed circuit board has four ends extended from the center area and connected to the test head of the semiconductor test system.

13. A probe contact system as defined in claim 7, wherein a pitch between two signal lines on the flexible printed circuit board at the contact center area is smallest and is enlarged toward the end of the flexible printed circuit board.

14. A probe contact system as defined in claim 7, wherein each of said conductive elastomer sheet is an elastic sheet with unidirectional conductivity by having a plurality of conductive wires in a direction vertical with the surface of the contactor carrier.

* * * * *